(12) United States Patent
Staiculescu et al.

(10) Patent No.: US 6,624,521 B2
(45) Date of Patent: Sep. 23, 2003

(54) FLIP CHIP DESIGN ON A COPLANAR WAVEGUIDE WITH A PSEUDO-COAXIAL GROUND BUMP CONFIGURATION

(75) Inventors: Daniela Staiculescu, Atlanta, GA (US); Joy Laskar, Atlanta, GA (US)

(73) Assignee: Georgia Tech Research Corp., Atlanta, GA (US)

( * ) Notice: Subject to any disclaimer, the term of this patent is extended or adjusted under 35 U.S.C. 154(b) by 0 days.

(21) Appl. No.: 09/910,284

(22) Filed: Jul. 20, 2001

(65) Prior Publication Data

US 2003/0015804 A1 Jan. 23, 2003

(51) Int. Cl.[7] ............... H01L 29/40; H01L 23/48; H01L 23/52
(52) U.S. Cl. ............ 257/778; 257/786; 257/737; 257/695; 257/691; 257/664
(58) Field of Search ................ 257/662, 661, 257/664, 692, 691, 695, 737, 778, 786, 773, 728, 725, 738, 730, 797

(56) References Cited

U.S. PATENT DOCUMENTS

| | | | |
|---|---|---|---|
| 5,258,577 A | 11/1993 | Clements | 174/88 R |
| 5,329,423 A | 7/1994 | Scholz | 361/760 |
| 5,468,681 A | 11/1995 | Pasch | 437/183 |
| 5,477,086 A | 12/1995 | Rostoker et al. | 257/737 |
| 5,522,132 A * | 6/1996 | Mattei | 29/846 |
| 6,057,600 A * | 5/2000 | Kitazawa et al. | 257/691 |
| 6,221,753 B1 | 4/2001 | Seyyedy | 438/613 |
| 6,232,212 B1 | 5/2001 | Degani et al. | 438/612 |
| 6,239,385 B1 * | 5/2001 | Schwiebert et al. | 174/261 |
| 6,538,316 B2 * | 3/2003 | Maetani | 257/700 |

FOREIGN PATENT DOCUMENTS

JP   10-064956   * 6/1998   .................. 21/60

* cited by examiner

Primary Examiner—Nathan J. Flynn
Assistant Examiner—Victor A. Mandala, Jr.
(74) Attorney, Agent, or Firm—Thomas, Kayden, Horstemeyer & Risley, LLP

(57) ABSTRACT

A flip chip assembly is disclosed that includes a coplanar waveguide launch with a transmission line, and a bump interconnection that includes multiple ground bumps. The transmission line may be a radial transmission line. Similarly, the ground bumps may be arranged in a pseudo-coaxial configuration so as to effect a vertical transition in the flip chip assembly. A method is also disclosed that includes the steps of: providing a coplanar waveguide transmission line launch; providing a chip for attachment to the coplanar waveguide launch; arranging one or more ground bumps on the coplanar waveguide launch; and forming a bump interconnection between the coplanar waveguide launch and the chip. The coplanar waveguide launch provided in this method may include a radial transmission line. The step of arranging the multiple ground bumps may include the step of arranging multiple ground bumps in a pseudo-coaxial configuration.

18 Claims, 4 Drawing Sheets

FLIP CHIP DESIGN ON A COPLANAR WAVEGUIDE WITH A PSEUDO-COAXIAL GROUND BUMP CONFIGURATION

TECHNICAL FIELD

The present invention is generally related to integrated circuits and, more particularly, is related to a flip chip assembly and method for producing a flip chip assembly.

BACKGROUND OF THE INVENTION

Along with rapid advances in microwave and millimeter wave system development throughout the last few years, the choice of the packaging interconnection solution has become a very important issue. For microwave circuit applications, as well as other applications, low cost, high density and short transition interconnect are considered to be the main advantages of the flip chip technique.

A flip chip is a semiconductor chip or die that has bumped terminations spaced around the active surface of the die and is intended for face-two-face attachment to a substrate or another semiconductor die. The bumped terminations of the flip chips are usually in the configuration of an array of balls. In this configuration, an array of minute balls or bumps are disposed on an attachment surface of a semiconductor die. The attachment of a flip chip to a substrate or another semiconductor involves aligning the balls or bumps on the flip chip with a plurality of contact points (configured to be a mere image of the bump arrangement on the flip chip) on a facing surface of the substrate. A plurality of bumps may also be formed on a facing surface of the substrate at the contact point. A quantity of liquid flux is often applied to the face of the chip and/or substrate, and the chip and substrate are subjected to an elevated temperature to affect refluxing or soldering of the bumps on the chips and/or corresponding bumps on the substrate.

FIG. 1 is a side view of a conventional flip chip assembly 100. The flip chip 100 of FIG. 1 shows a coplanar waveguide 110 to coplanar waveguide 110 transition. The coplanar waveguides are attached to a mounting substrate 130. The attached chip is connected to the mounted substrate 120. The coplanar waveguides 110 are connected to the attached chip via ground bumps 140.

FIGS. 2A and 2B represent top views of the conventional coplanar waveguide 110 of the flip chip assembly 100 of FIG. 1. The coplanar waveguide 110 includes a transmission line 150 and a signal bump 160 placed thereon. Around the transmission line 150, the mounting substrate 130 is exposed. On the coplanar waveguide 110 are attached a single ground bump 140 on either side of the signal bump 160. FIG. 2A shows the configuration of the single bump 140 on each side of the signal bump 160, and FIG. 2B depicts two ground bumps 140 on each side of the signal bump 160. FIG. 2C is a top view of an attached chip 170 that is placed on the coplanar waveguide 110 of FIGS. 1A and 2B to form the conventional flip chip assembly 100 depicted in FIG. 1.

There are numerous variations to the standard flip chip attachment technique. For example, U.S. Pat. No. 5,329,423 issued Jul. 12, 1994 to Scholz relates to a demountable flip chip assembly comprising a first substrate having a contact site with raised bump and a second substrate having a depression for a contact site. The raised bumps are pressed into the depressed areas to electrically and mechanically connect the first substrate to the second substrate without using reflowed solder. Thus, the first substrate can be removed from the second substrate without damaging either substrate.

U.S. Pat. No. 5,477,086 issued Dec. 19, 1995 to Rostoker et al. relates to a flip chip attachment technique involving forming a concave conductive bump on one substrate (such as the printed circuit board) to receive and align the solder balls on the other substrate (such as the semiconductor die). The solder balls and/or the concave conductive bump are reflowed to fuse them together.

It is also known in the art that conductive polymers or resins can be utilized in place of solder balls. U.S. Pat. No. 5,258,577 issued Nov. 2, 1993 to Clements relates to a substrate and a semiconductor die with a discontinuous passivation layer. The discontinuities result in vias aligned with the contact points between the substrate and the semiconductor die. A resin with spaced conductive metal particles suspended therein is disposed within the vias to achieve electrical contact between the substrate and the semiconductor die. U.S. Pat. No. 5,468,681 issued Nov. 21, 1995 to Pasch relates to interconnecting conductive substrates using an interposer having conductive plastic-filled vias.

Such flip chip and substrate attachments (collectively "electronic packages") are generally comprised of dissimilar materials that expand at different rates on heating. The most severe stress is due to the inherently large thermal coefficient of expansion ("TCE") mismatch between the plastic and the metal. These electronic packages are subject to two types of heat exposures: process cycles which are often high in temperature but few in number; and operation cycles, which are numerous but less extreme. If either the flip chip(s) and/or substrate(s) are unable to repeatedly bear their share of the system thermal mismatch over its lifetime, the electronic package will fracture, thereby destroying the functionality of the electronic package.

As an electronic package dissipates heat to its surroundings during operation, or as the ambient system temperature changes, differential thermal expansions cause stresses to be generated in the interconnection structure (solder ball bonds) between the semiconductor die and the substrate. These stresses produce instantaneous elastic and, most often, plastic strain, as well as time-dependent (plastic and elastic) strains in the interconnection structure, particularly at the weakest interconnection structure. Thus, the thermal expansion mismatch between chip and substrate will cause a shear displacement to be applied on each terminal which can fracture the solder connection.

The problems associated with thermal expansion match are also applicable to connections made with conductive polymers or resins. After curing, the polymers or resins become substantially rigid. The rigid connections are equally susceptible to breakage due to thermal expansion mismatch.

Thus, a heretofore unaddressed need exists in the industry to address the aforementioned deficiencies and inadequacies.

SUMMARY OF THE INVENTION

The present invention provides a flip chip assembly and method for producing a flip chip assembly.

Briefly described, one embodiment of the system, among others, can be implemented as follows. A flip chip assembly includes a coplanar waveguide transmission line launch and a bump interconnection that includes multiple ground bumps wherein the ground bumps are arranged in a pseudo-coaxial configuration. Further, the transmission line maybe a radial transmission line which facilitates the pseudo-coaxial vertical transition. The number of bumps may be, for example but not limited to, two, four, six, or eight or more than eight. Further, the bumps may not necessarily be arranged in a pseudo-coaxial configuration if a radial transmission line is used.

The present invention can also be viewed as providing methods for producing a flip chip assembly. In this regard, one embodiment of such a method, among others, can be broadly summarized by the following steps: providing a coplanar waveguide transmission line launch; arranging at least one ground bump on a pseudo-coaxial configuration; and forming a bump interconnection. The transmission line may be a radial transmission line. The multiple ground bumps may range in number, for example but not limited to, two, four, six, eight or more. Additionally, if a radial transmission line is used, the multiple ground bumps maybe arranged in a non-pseudo-coaxial configuration.

Other assemblies, methods, features, and advantages of the present invention will be or become apparent to one with skill in the art upon examination of the following drawings and detailed description. It is intended that all such additional methods, features, and advantages be included within this description, be within the scope of the present invention, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE INVENTION

The invention presents a novel approach to designing a flip chip package. The invention focuses on the use of multiple, or a plurality of, ground bumps. The multiple ground bump configurations use a modified coplanar waveguide (CPW) launch. Further improvement in electrical performance can be achieved with modified transmission line geometry. The invention is flexible with respect to the number of ground bumps, the geometry of the ground bumps and the geometry of the transmission line. The invention represents a foundation for thorough design rule development for RF and microwave flip chip applications, as well as other applications in which these properties maybe desirable.

Figure 3A:
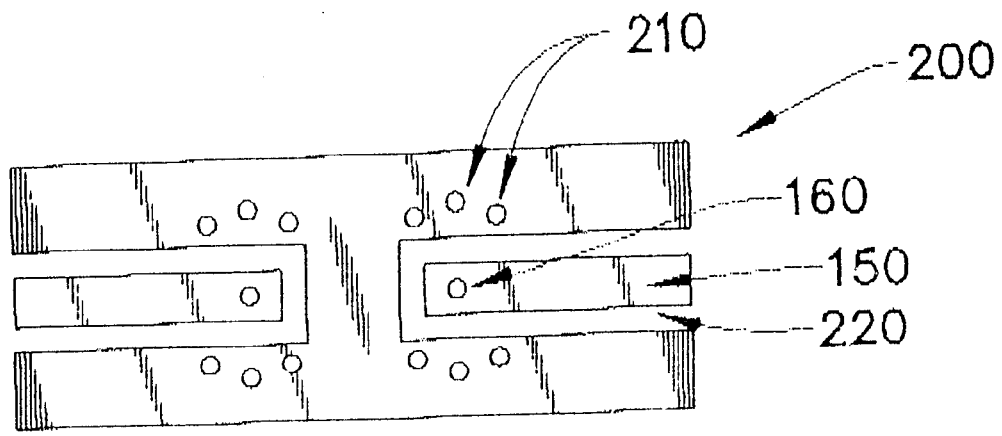
FIGS. 3A and 3B are top views of a coplanar waveguide of the present invention having pseudo-coaxial placement of (A) six ground bumps; and (B) eight ground bumps.
Figure 3B:
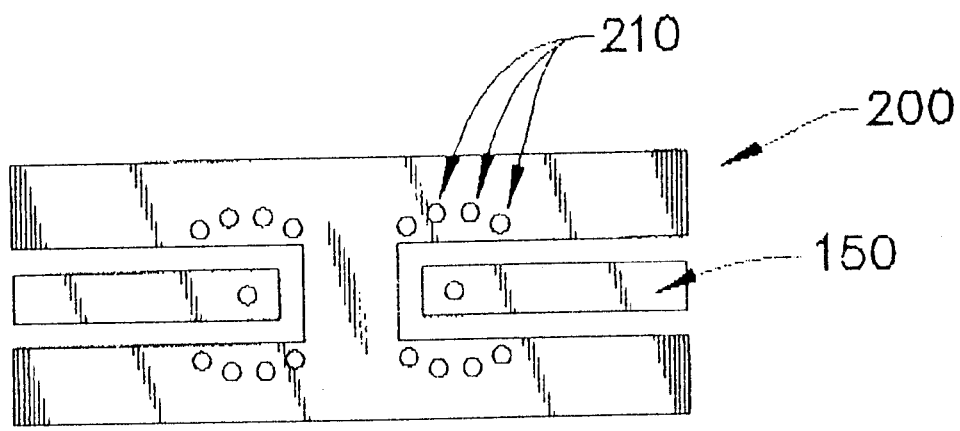

Both mechanical and electrical connectivity are improved by the flip chip assembly 500 of the present invention. FIGS. 3A and 3B illustrate top views of embodiments of a coplanar waveguide 200 (CPW) that is used in the flip chip assembly 500 of the present invention. In both FIGS. 3A and 3B, the CPW includes a conventional transmission line launch 150 on which is placed a signal bump 160. Exposed substrate surrounds each of the transmission line launches 150. On either side of the transmission line launch 150 are a set or plurality of ground bumps 210 arranged so as to form a pseudo-coaxial vertical transition. "Pseudo-coaxial" for the purposes of this document means that the bumps are placed in a configuration that resembles a coaxial configuration, whereby the ground bumps are placed in a somewhat circular fashion around the signal bump. "Vertical transition" for the purposes of this document means that the signal flow moves vertically through the flip chip via the bumps. The signal flow may also occur horizontally through the transmission lines, forming a "horizontal transition."

FIG. 3A illustrates a six ground bump configuration, and FIG. 3B illustrates an eight ground bump configuration, but it may be envisioned by one skilled in the art that other numbers of ground bumps may be used. For example, but not limited to these numbers, two, four or more than eight ground bumps may also be employed in other embodiments of the invention.

Figure 3C:
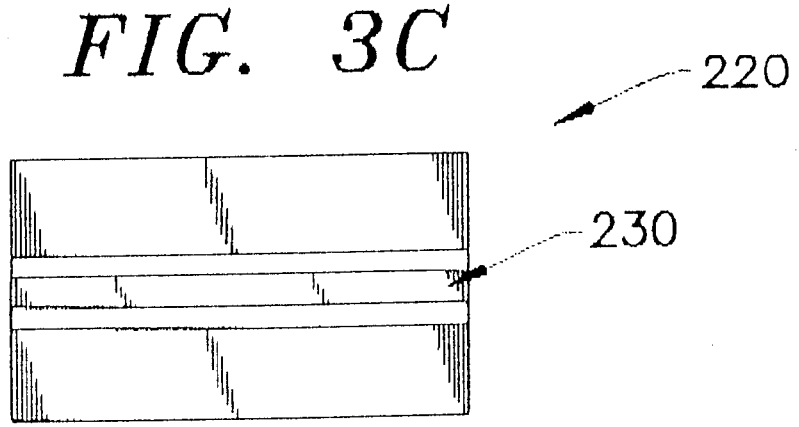
FIG. 3C is a top view of an attached chip that is placed on either of the coplanar waveguides of the present invention of FIGS. 3A and 3B.

FIG. 3C illustrates a top view of an attached chip 220 that is placed on the CPW 200 of FIGS. 3A and 3B. The attached chip includes the transmission line 230. The transition of the CPW 200 and the attached chip 220 form one possible embodiment of the flip chip assembly 500.

Figure 4A:
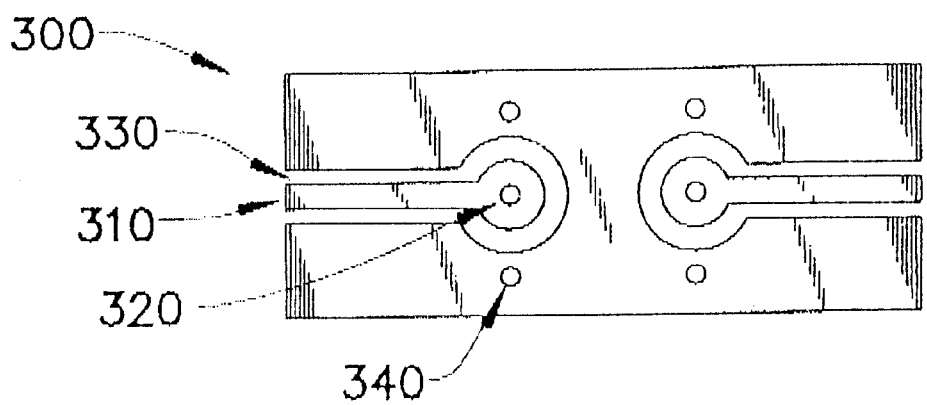
FIGS. 4A and 4B are top views of a coplanar waveguide of a second embodiment of the present invention with radial transmission lines and with (A) a single ground bump on either side of the radial transmission line; and (B) two ground bumps on either side of the radial transmission line.
Figure 4B:
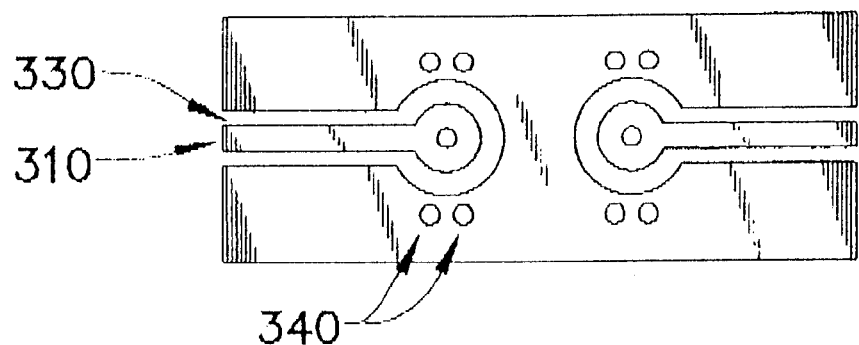

FIGS. 4A and 4B illustrate top views of a CPW 300 of two additional exemplary embodiments of the flip chip assembly 500. The CPW 300 of FIGS. 4A and 4B includes a radial transmission line 310 on which is disposed a signal bump 320. Around the radial transmission line 310 is exposed substrate 330 which separates the signal bump from the ground bumps 340. FIG. 4A represents the configuration of a single ground bump 340 on each side of the signal bump 320, and FIG. 4B illustrates the configuration of two ground bumps 340 on either side of the signal bump 320. FIGS. 4A and 4B represent two and four, respectively, ground bumps, and it would be understood by one skilled in the art that other numbers of ground bumps may be used. For example, but not limited to these numbers, six, eight, or more than eight ground bumps may also be employed in other embodiments of the invention.

Figure 4C:
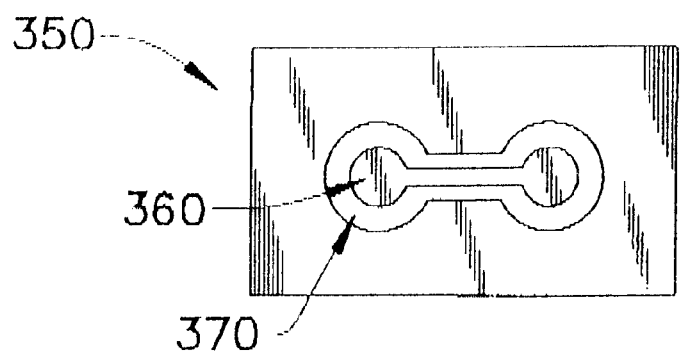
FIG. 4C is a top view of an attached chip that is placed on either of the coplanar waveguides of FIGS. 4A and 4B to form a flip chip assembly of the present invention.

FIG. 4C illustrates the top view of an exemplary attached chip 350 that is placed on the CPW 300 of either FIGS. 4A or 4B to form additional embodiments of the flip chip assembly 500. Included on the attached chip 350 is a radial-shaped transmission line 360 and exposed substrate 370 surrounding the transmission line 360.

Figure 5A:
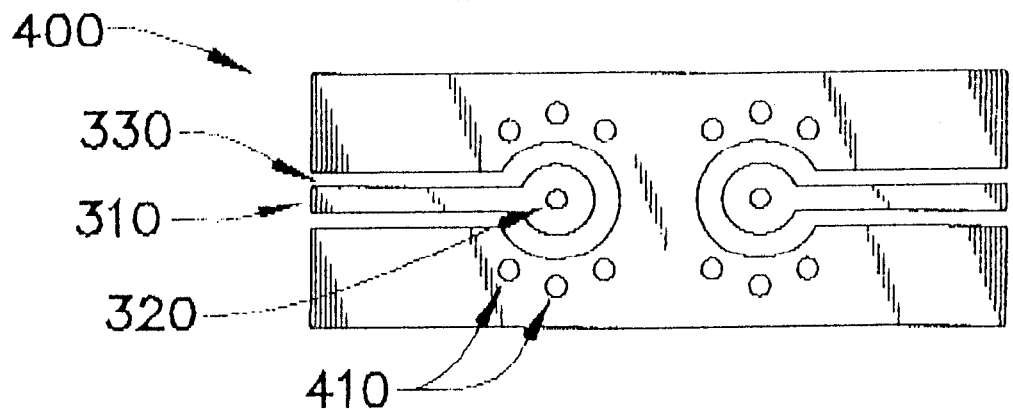
FIGS. 5A and 5B are top views of the coplanar waveguides of another embodiment of the present invention with radial transmission lines and with (A) six ground bumps arranged in a pseudo-coaxial configuration; and (B) eight ground bumps arranged in a pseudo-coaxial configuration around the radial transmission line.
Figure 5B:
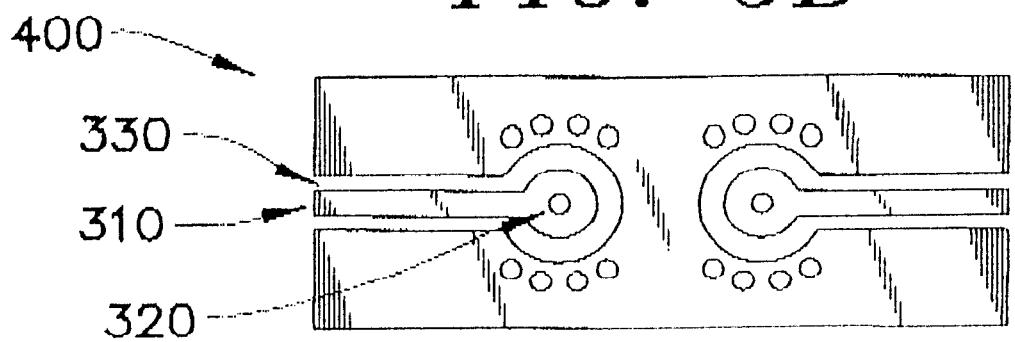

FIGS. 5A and 5B illustrate top views of the CPW 400 included in exemplary embodiments of the flip chip assembly 500. The CPW 400 includes a radial transmission line 310 on which is disposed the signal bump 320. As in other CPW's, the CPW 400 includes exposed substrate 330 surrounding the radial transmission line 310. Multiple ground bumps 410 are arranged around the signal bump 320 so as to effect a pseudo-coaxial vertical transmission. FIGS. 5A and 5B depict six and eight ground bumps, respectively, but it would be understood by one skilled in the art that other numbers of ground bumps may be used. For example, but not limited to these numbers, two, four, or more than eight ground bumps may also be employed in other embodiments of the invention.

Figure 5C:
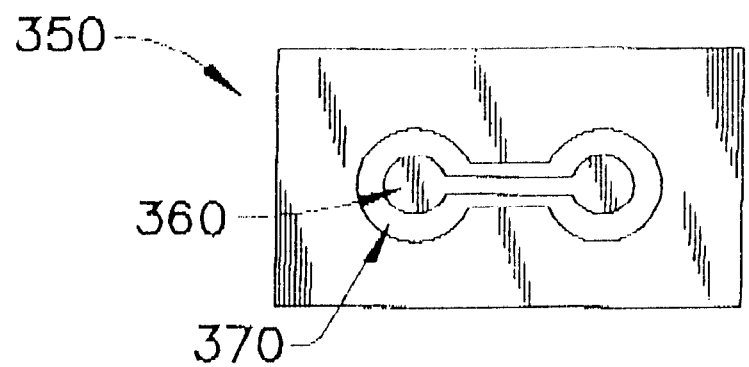
FIG. 5C is a top view of an attached chip that is placed on either of the coplanar waveguides of FIGS. 5A and 5B to form a flip chip assembly of one embodiment of the present invention.

FIG. 5C illustrates the top view of the exemplary attached chip 350 which, when disposed upon the CPW 400 of either FIG. 5A or FIG. 5B, forms alternate embodiments of the flip chip assembly 500.

Many different types of materials may be used to affect the transition. As noted before, differences in coefficient of thermal expansion (CTE) may be a problem. In a preferred embodiment of the invention, alumina to alumina is used in the transition as the substrate, thus avoiding the problems of differences in CTE of the materials. Other materials may be used, for example but not limited to, dielectric materials and ceramics, as can be envisioned by one skilled in the art depending upon the desired application.

Similarly, material for the signal bump or multiple ground bumps may vary. The material of the bumps may include but is not limited to, for example, any solder ball material, tin compositions (Sn), gold (Au), and/or conductive polymers or resins. In the preferred embodiment, gold (Au) is used, but one skilled in the art may use another or a combination of different types of materials, depending upon the desired application.

The flip chip assembly 500 may be fabricated and assembled using any conventional flip chip fabrication method. The flip chip assembly 500 preferably incorporates a substrate and die. One skilled in the art could envision that there are no restrictions on the substrate and die with respect to thickness and geometry, and material used. Rather, characteristics of die and substrate will depend on the application sought for the fabricated flip chip assembly 500. The substrate may be of a size, for example but is not limited to, two inches by two inches, and the die may comprise, for example but not limited to, ten-mil thick 99.6% alumina plated with, for example but not limited to 50 microinch gold (Au) over palladium (Pd) on titanium tungsten (TiW).

The plated substrate and die of the desired material, thickness and geometry is then patterned using any conventional patterning technique that enables design of the desired circuitry. For example, the die and substrate may be photo-patterned and etched to achieve the design circuitry. The die is attached to the substrate using any conventional flip chip technique. For example, the flip chip technique commonly known in the art employs for example, but is not limited to, gold (Au) stud bumps and tin (Sn) solder to form the interconnection. Again, one skilled in the art would understand that any type of conducting material might be used for the bump interconnections, depending on design objectives and cost.

Various attachment methods may be employed which aid in bump placement. Bond windows may be attached to the die and substrate to act as targets for bump placement. Further, dams may be formed to contain the material during reflow. The bond windows may be made of, for example, but are not limited to titanium (Ti) and may be, for example, sputtered onto the die and substrates. The dams may be made of, for example, solder, which contains the solder during reflow. Some attachment methods do not alter the substrate, such as the conventional use of thermo-compressed stud bumps. Stud bumps may be then bonded on the die and the interior of the windows. The bonding process may also use a conventional wire bonding method. In this method, a wire bond is laid, the wire is cut, resulting in a bump left at the end of the wire. In this method, the wire may be of various dimensions and various conducting materials. For example, a conventional commercially available 1-mil diameter wire may be used that is made of, for example, but not limited to, 99% Au, 1% Pd.

On the substrate, tin (Sn), or any other suitable material, is sputtered inside the windows to serve as bond pads for the corresponding die bumps. The die is then flipped and the bumps are aligned with the pads on the substrate. The entire assembly may be reflowed at any range of temperatures that will vary depending on the composition of the material(s) being reflowed. For example, a typical reflow may occur at, for example but not limited to, 350° C. to form the flip chip interconnection.

Figure 1:
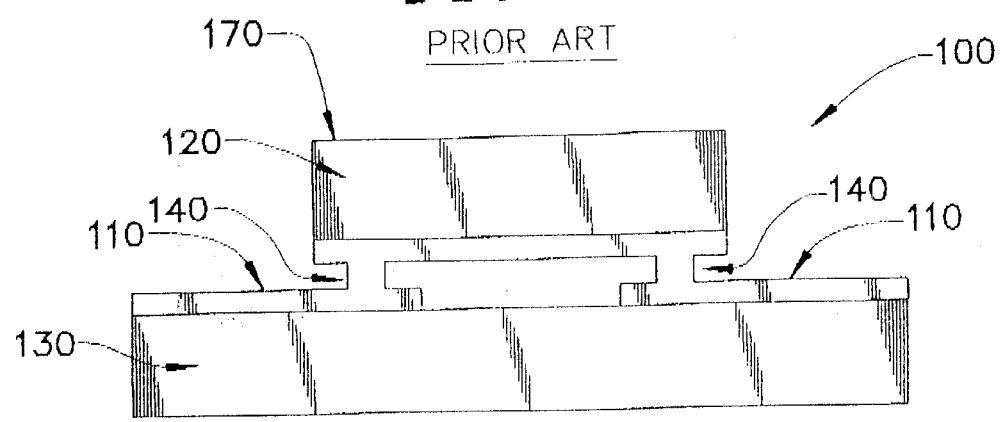
FIG. 1 is a side view of a conventional flip chip assembly featuring a coplanar waveguide to coplanar waveguide transmission line transition.
Figure 2A:
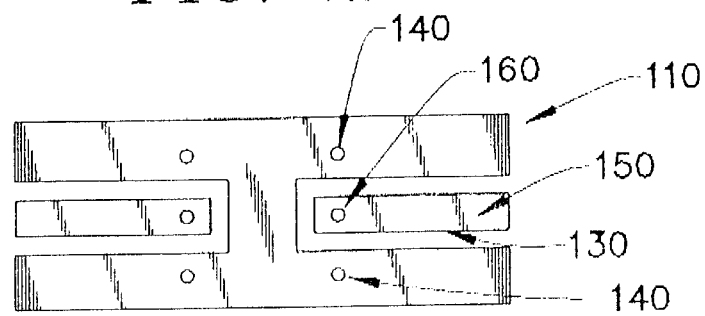
FIGS. 2A and 2B are top views of the conventional coplanar waveguide of FIG. 1 with non-radial transmission lines with (A) a single ground bump on each side of the signal bump; and (B) two ground bumps on either side of the signal bump.
Figure 2B:
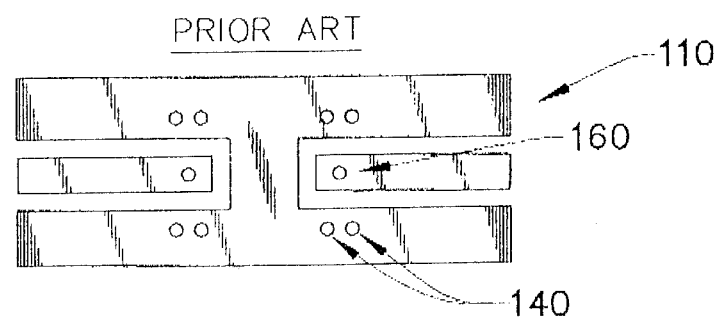
Figure 2C:
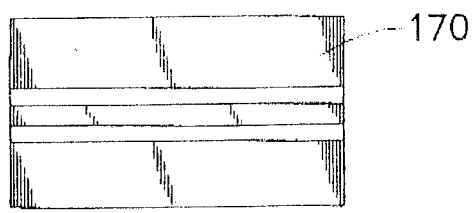
FIG. 2C is a top view of an attached chip that is placed on either of the coplanar waveguides of FIGS. 2A and 2B to form a conventional flip chip assembly depicted in FIG. 1.

Table 1 below compares the return loss, a measure of performance of the flip chip assembly 500, of a prior art flip chip assembly (of FIG. 2A) with flip chip assemblies 500 of the present invention. While the measurements below were performed at 15 GHz, this process could be applied to all high-frequency integrated circuit (IC) processes, for example, but not limited to 1 GHz to 50 GHz, depending upon the application, as would be known to one skilled in the art.

TABLE 1

Comparing Return Loss of Invention with Prior Art

| STRUCTURE (FIG. NO.) | NUMBER OF GROUND BUMPS PER TRANSITION | TRANSMISSION LINE LAUNCH | RETURN LOSS @ 15 GHz (dB) |
|---|---|---|---|
| 2A (Prior Art) | 2 | Non-radial | 18.7 |
| 4A | 2 | Radial | 23 |
| 3B | 8 | Non-radial | 18.5 |
| 5B | 8 | Radial | 25 |

Also provided in the present invention is a method for preparing the flip chip assembly 500. The method includes the steps of providing a coplanar waveguide launch 200, 300, or 400 with a transmission line 150; arranging multiple ground bumps 210, 340, or 410 in a pseudo-coaxial configuration (FIGS. 3A and B and FIGS. 5A and B); and forming a bump interconnection between the coplanar waveguide launch 200, 300 or 400 and the attached chip 220. The number of multiple ground bumps 340 or 410 that are arranged in a pseudo-coaxial configuration may be for example, but not limited to, four, six, eight or more than eight bumps. In a preferred embodiment, eight bumps are arranged in a pseudo-coaxial configuration.

The method of the present invention may include in the step of providing the coplanar waveguide launch 200, 300, or 400 with a radial transmission line 310. If a radial transmission line 310 is used in the coplanar waveguide launch 300 or 400, the multiple ground bumps 210, 340, or 410 may be arranged in either a non-pseudo-coaxial configuration (FIGS. 4A and 4B) or in a pseudo-coaxial configuration (FIGS. 5A and 5B). If the multiple ground bumps 340 or 410 are arranged in a non-pseudo coaxial configuration, the number of bumps may include for example, but are not limited to, two, four, or more than four bumps. The number of multiple ground bumps 340 or 410 that are arranged in a pseudo-coaxial configuration may be for example, but not limited to, four, six, eight or more than eight bumps.

It should be emphasized that the above-described embodiments of the present invention, particularly, any "preferred" embodiments, are merely possible examples of implementations, and are merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

Having thus described the invention, at least the following is claimed:

1. A flip chip assembly, comprising:

a substrate;

a coplanar waveguide launch disposed upon the substrate with a radial transmission line surrounded by exposed substrate; and a bump interconnection including a ground bump, wherein the bump interconnection is disposed upon the coplanar waveguide launch, and wherein the bump interconnection includes a plurality of ground bumps, wherein the ground bumps are arranged in a pseudo-coaxial configuration.

2. The flip chip assembly of claim 1, wherein there are six ground bumps.

3. The flip chip assembly of claim 1, wherein there are eight ground bumps.

4. The flip chip assembly of claim 1, wherein there are more than eight ground bumps.

5. A flip chip assembly, comprising:

a coplanar waveguide launch with a radial transmission line; and a bump interconnection including multiple ground bumps, wherein the ground bumps are arranged in a pseudo-coaxial configuration, and wherein the bump interconnection is disposed on the coplanar waveguide launch.

6. The flip chip assembly of claim 5, wherein there are six ground bumps.

7. The flip chip assembly of claim 5, wherein there are eight ground bumps.

8. The flip chip assembly of claim 5, wherein there are more than eight ground bumps.

9. A method, comprising the steps of:

providing a coplanar waveguide radial transmission line launch;

providing a chip for attachment to the coplanar waveguide launch;

arranging multiple ground bumps in a pseudo-coaxial configuration on the coplanar waveguide launch; and forming a bump interconnection between the coplanar waveguide launch and the chip.

10. The method of claim 9, wherein the step of arranging multiple ground bumps in a pseudo-coaxial configuration comprises the step of: arranging six ground bumps in a pseudo-coaxial configuration.

11. The method of claim 9, wherein the step of arranging multiple ground bumps in a pseudo-coaxial configuration comprises the step of: arranging eight ground bumps in a pseudo-coaxial configuration.

12. The method of claim 9, wherein the step of arranging multiple ground bumps in a pseudo-coaxial configuration comprises the step of: arranging more than eight ground bumps in a pseudo-coaxial configuration.

13. The method of claim 9, wherein the coplanar waveguide launch is disposed upon a substrate, and wherein the radial transmission line is surrounded by exposed substrate.

14. A method, comprising the steps of:

providing a coplanar waveguide launch with a radial transmission line;

providing a chip for attachment to the coplanar waveguide launch;

arranging multiple ground bumps in a pseudo-coaxial configuration on the coplanar waveguide launch; and forming a bump interconnection between the coplanar waveguide launch and the chip.

15. The method of claim 14, wherein the step of arranging multiple ground bumps in a pseudo-coaxial configuration comprises the step of: arranging six ground bumps in a pseudo-coaxial configuration.

16. The method of claim 14, wherein the step of arranging multiple ground bumps in a pseudo-coaxial configuration comprises the step of: arranging eight ground bumps in a pseudo-coaxial configuration.

17. The method of claim 14, wherein the step of arranging multiple ground bumps in a pseudo-coaxial configuration comprises the step of: arranging more than eight ground bumps in a pseudo-coaxial configuration.

18. The method of claim 14, wherein the coplanar waveguide launch is disposed upon a substrate, and wherein the radial transmission line is surrounded by exposed substrate.

* * * * *